US009620398B2

(12) United States Patent
Jin et al.

(10) Patent No.: US 9,620,398 B2
(45) Date of Patent: Apr. 11, 2017

(54) APPARATUS FOR HANDLING A SEMICONDUCTOR COMPONENT

(75) Inventors: Jianping Jin, Singapore (SG); Lee Kwang Heng, Singapore (SG)

(73) Assignee: Semiconductor Technologies & Instruments PTE LTD, Singapore (SG)

( * ) Notice: Subject to any disclaimer, the term of this patent is extended or adjusted under 35 U.S.C. 154(b) by 694 days.

(21) Appl. No.: 12/722,553

(22) Filed: Mar. 12, 2010

(65) Prior Publication Data
US 2010/0232915 A1 Sep. 16, 2010

(30) Foreign Application Priority Data

Mar. 13, 2009 (SG) .................................. 200901753

(51) Int. Cl.
*H01L 21/677* (2006.01)
*H01L 21/687* (2006.01)
(52) U.S. Cl.
CPC .. *H01L 21/67742* (2013.01); *H01L 21/68764* (2013.01)
(58) Field of Classification Search
CPC .................... H01L 21/67742; H01L 21/68764
USPC ....... 414/941, 225.01, 676, 749.1, 797, 737, 414/627, 752.1; 294/183, 185
See application file for complete search history.

(56) References Cited

U.S. PATENT DOCUMENTS

| 3,848,752 | A | * | 11/1974 | Branch et al. | ............. | 414/752.1 |
| 4,261,681 | A | * | 4/1981 | Gates | .......................... | 414/744.2 |
| 4,683,654 | A | * | 8/1987 | Scholten et al. | ................ | 29/832 |
| 5,469,953 | A | * | 11/1995 | Igarashi et al. | ............ | 198/345.2 |
| 6,168,220 | B1 | * | 1/2001 | Schmalz et al. | ............. | 294/186 |
| 6,224,316 | B1 | * | 5/2001 | Hebrank et al. | .............. | 414/404 |
| 6,752,581 | B1 | * | 6/2004 | Lust et al. | ............... | 414/225.01 |
| 6,979,032 | B2 | * | 12/2005 | Damhuis | ......................... | 294/65 |
| 7,162,884 | B2 | * | 1/2007 | Alles | .............................. | 62/178 |

* cited by examiner

*Primary Examiner* — Glenn Myers
(74) *Attorney, Agent, or Firm* — Hauptman Ham, LLP

(57) ABSTRACT

An apparatus for handling or transferring a semiconductor component. The apparatus comprises a first structure and a second structure coupled thereto. The first structure and the second structure define a vacuum chamber therebetween. The second structure comprises at least one module coupled thereto. Each module comprises a passageway defined therethrough. Vacuum is applied through the passageway for facilitating pick up of the semiconductor component at a first position and for securing the semiconductor component to the module during displacement of the module from the first position to a second position. The apparatus comprises a plunger. Displacement of the plunger from a retracted position to an extended position impedes fluid communication between the passageway of the module and the chamber. Displacement of the plunger to the extended position further causes purging of air through the passageway of the module to thereby detach the semiconductor component from the module. A method for transferring the semiconductor component using the apparatus is also provided by the present invention.

33 Claims, 8 Drawing Sheets

APPARATUS FOR HANDLING A SEMICONDUCTOR COMPONENT

FIELD OF INVENTION

The present invention relates generally to handling or transfer of semiconductor components. More specifically, the present invention relates to an apparatus and a method for facilitating transfer of semiconductor components by the application of one or both of vacuum and purged air.

BACKGROUND

The fabrication of semiconductor components, for example semiconductor wafers, dies and integrated circuit (IC) chips, typically involves numerous processing steps. Such processing steps typically include, but are not limited to, visual inspection and electrical testing of the semiconductor components.

Each processing step typically occurs at a different and distinct processing station and by a different processing module. There currently exist several systems and apparatuses for transferring the semiconductor components between processing stations. Typically, the semiconductor component is first picked up or received by the system or apparatus at a first position (or an input position) and transferred between the different processing stations before being thereafter deposited or detached at a second position (or output position). The semiconductor components are processed at the processing stations either while in motion or when temporarily stationary at the processing stations depending on the processing requirements.

Several existing or conventional systems or apparatuses for transferring semiconductor components comprise a rotatable turret having multiple pick-up heads (also known as semiconductor component handlers). The pickup heads are operable for receiving, holding, and transferring the semiconductor components. Rotation of the turret displaces the pick-up heads along a predetermined travel profile. Generally, the semiconductor components received and held by the pickup heads are transferred to be positioned at the different processing stations for processing at the processing stations as the pick-up heads are displaced along the predetermined travel profile.

Each pick-up head or semiconductor handler comprises means or a mechanism for picking up or receiving the semiconductor component at the first position, as well as means or a mechanism for depositing or detaching the semiconductor component at the second position. In addition, each pick-up head comprises means or a mechanism for securing or holding the semiconductor component thereto during displacement along the predetermined travel profile.

A first exemplary existing turret structure 200, as partially shown in FIG. 1a and FIG. 1b, comprises a central shaft 202 and a rotatable portion 204 coupled to the central shaft 202. The rotatable portion 204 typically comprises at least one pick-up head 208, which picks up semiconductor components at a first position, rotates around the central shaft 202 for transferring the semiconductor components attached thereto, and deposits the semiconductor component at a second position. The central shaft 202 comprises a number of air tubes, each having a fixed spatial position. Vacuum is applied via a first air tube 206, and through a pick-up head 208, for picking up the semiconductor component at the first position. The pick-up head 208 then rotates around the central shaft 202 to the second position. At the second position, air is purged through a second air tube 210, and thereafter through the pick-up head 208 for detaching the semiconductor component from the pick-up head 208. As shown in FIG. 1a, the pick-up head 208 is directly connected to the first air tube 206, and vacuum pressure is stable therebetween. The same is the case as shown in FIG. 1b where the vacuum pressure is stable between the pick-up head 208 and the second air tube 210. When the pick-up head 208 is displaced from the first position to the second position, no vacuum pressure is applied thereto. This absence of applied vacuum pressure often results in dislodging of the semiconductor component from the pick-up head 208. A problem with this first exemplary existing turret structure 200 is a possibility of an insufficient vacuum for adequately securing the semiconductor component to the pick-up head 208 during rotation of the pick-up head 208 around the central shaft 202 from the first position to the second position. Accordingly, this may result in unwanted dislodging of the semiconductor components from the pick-up head 208 during the rotation of the pick-up head 208 from the first position to the second position. In order to prevent the unwanted dislodgement of the semiconductor components from the pick-up heads 208, the rotation of the pick-up heads 208 has to occur at a relatively high speed. However, centripetal force exerted on the semiconductor component attached to the pick up head 208 generally increases with the increasing speed of rotation of the pick-up head 208. Accordingly, a fine balance or optimization between applied vacuum and speed of rotation needs to be achieved for securing the semiconductor components to the pick-up head 208 of the first exemplary existing turret structure 200. This fine balance or optimization is generally difficult to achieve, especially with the increased need for speed during transfer of semiconductor components.

A second exemplary turret structure 250, as shown in FIG. 2, comprises a central shaft 252, a rotatable portion 254 comprising multiple pick-up heads 256, and a gap of chamber 258 defined between the central shaft 252 and the rotatable portion 254. With the second exemplary turret structure 250, vacuum is continuously maintained within the chamber 258. The chamber 258 functions as a buffer against changes to vacuum pressure and helps to overcome an unstable applied vacuum found in the first exemplary existing turret structure 200. Vacuum is constantly applied through each pick-up head 256 onto the semiconductor component attached thereto during rotation of the pick-up head 256 about the central shaft 252. Maintenance of a continuous vacuum within the chamber 258 facilitates application of a continuous vacuum through the pick-up head 256 for securing the semiconductor component thereto during rotation. However, the presence of the chamber 258, and therefore vacuum, between the central shaft 252 and the rotatable portion 254 increases difficulty, due to the additional volume of vacuum in the chamber 258, to accurately and quickly adjusting the pressure of air being purged through the pick-up heads 256 for subsequently detaching the semiconductor components from the pick-up heads 256. In addition, air being purged passes through the chamber 258, thereby affecting the vacuum pressure within the chamber 258. Accordingly, maintaining an optimum and constant pressure within the chamber 258 is significantly difficult with the turret structure 250.

U.S. Pat. No. 6,298,547 of Okuda et al. proposes an apparatus for transferring semiconductor components. More specifically, the apparatus of U.S. Pat. No. 6,298,547 utilizes positive and negative air pressures (i.e. blowing and suction or vacuum) for removing and mounting components to pick-up heads or nozzles. Vacuum is applied to hold the components to the pick-up heads during displacement of the pick-up heads. Multiple valves are required for the pick-up heads of the apparatus of U.S. Pat. No. 6,298,547. The use of multiple valves for the multiple pick-up heads increases the complexity of controlling application of vacuum or air through the pick-up heads at any given time. Due to the substantial volume within component 224 of U.S. Pat. No. 6,298,547, it may also be difficult to apply vacuum, or to purge air, quickly through the pick-up heads. Thus, the pick and place process may be slowed significantly. The design of U.S. Pat. No. 6,298,547 is more suitable for theta correction of semiconductor components and is very difficult to implement on rotary semiconductor component transfer systems.

There therefore exist needs for improved apparatuses for transferring semiconductor components, especially apparatuses comprising turret structures, for enhancing accuracy and efficiency of at least one of pick-up of the semiconductor components by the pick-up heads, securing of the semiconductor components to the pick-up heads during rotation or displacement thereof, and subsequent detachment of the semiconductor components from the pick-up heads.

SUMMARY

Embodiments of the present invention provide apparatuses and methods for handling or transferring semiconductor components. The apparatuses and the methods provided by the embodiments of the present invention addresses at least one of the needs described in the background.

In accordance with a first aspect of the present invention, there is disclosed an apparatus comprising a first structure and a second structure coupled to the first structure. The first structure and the second structure define a chamber therebetween. The second structure comprises a module having a passageway defined therethrough which is fluidly communicable with the chamber, the chamber for providing one of vacuum and fluid to the passageway. The apparatus further comprises a plunger coupled to the first structure, the plunger being displaceable within the chamber between a retracted position and an extended position. When at the extended position, the plunger is spatially disposed within the chamber for substantially impeding fluid communication between the chamber and the passageway. The displacement of the plunger to the extended position provides one of vacuum and fluid to the passageway to thereby facilitate one of attachment and detachment respectively of a semiconductor component to the module.

In accordance with a second aspect of the present invention, there is disclosed a method for handling a semiconductor component comprising receiving a semiconductor component by a module coupled to a first structure. The module comprises a passageway defined therethrough. The first structure is coupled to a second structure and defines a chamber therewith. The passageway is fluidly communicable with the chamber, the chamber for providing one of vacuum and fluid to the passageway. The method further comprises providing a plunger, the plunger being displaceable within the chamber between a retracted position and an extended position. When the plunger is at the retracted position, the chamber is in fluid communication with the passageway of the handler. In addition, when the plunger is at the extended position, the plunger is spatially disposed for substantially impeding fluid communication between the chamber and the passageway.

In accordance with a third aspect of the present invention, there is disclosed an apparatus for handling semiconductor components, the apparatus comprising a first structure and a second structure displaceable relative the first structure. The first structure and the second structure define a chamber therebetween. The second structure comprises a plurality of modules, each of the plurality of modules comprising a passageway that is fluidly communicable with the chamber, the chamber for providing one of vacuum and fluid pressure through the passageway of each of the plurality of modules. The apparatus further comprises a plunger coupled to the first structure and displaceable within the chamber between a retracted position to an extended position. When at the extended position, the plunger is spatially disposed within the chamber for impeding fluid exchange between the chamber and the passageway of the first of the plurality of modules. The displacement of the plunger to the extended position provides one of vacuum and fluid through the passageway of a first of the plurality of modules for facilitating attachment and detachment respectively of a semiconductor component to the module.

In accordance with a fourth aspect of the present invention, there is disclosed an apparatus for handling semiconductor components, the apparatus comprising a first structure and a second structure displaceable relative the first structure. The first structure and the second structure define a chamber therebetween. The displaceable structure comprises a plurality of modules, each of the plurality of modules comprising a passageway that is fluidly communicable with the chamber, the chamber for facilitating maintenance of a constant vacuum provided to the passageway of each of the plurality of modules. The apparatus further comprises a plunger displaceable within the chamber from a retracted position to an extended position for purging fluid through the passageway of a first module of the plurality of modules. When at the extended position, the plunger is spatially disposed for impeding fluid exchange between the chamber and the passageway of the first module to thereby substantially inhibit change to pressure of vacuum provided to the passageway of each of the other of the plurality of the modules.

In accordance with a fifth aspect of the present invention, there is disclosed method for handling a semiconductor component. The method comprising receiving the semiconductor component by a first module of a plurality of modules at a first position, each of the plurality of modules comprising a passageway defined therethrough and is coupled to a displaceable structure. The method further comprising displacing the first module from the first position to a second position about a first structure, the first structure and the displaceable structure defining a chamber therebetween, the chamber being fluidly communicable with the passageway of each of the plurality of modules for providing a constant vacuum thereto. The method also comprising displacing a plunger from a retracted position to an extended position within the chamber for facilitating purging of fluid through the passageway of the first module when the first module is at the second position. The displacement of the purging mechanism to the extended position spatially disposes the plunger for impeding fluid communication between the chamber and the passageway of the first module to thereby substantially change the pressure of vacuum provided to the passageway of each of the other of the plurality of the modules.

BRIEF DESCRIPTION OF THE DRAWINGS

Exemplary embodiments of the present invention are described hereinafter with reference to the figures, in which.

DETAILED DESCRIPTION

There are several conventional systems and apparatuses for transferring semiconductor components. Conventional systems and apparatuses typically comprise multiple pickup heads or semiconductor component handlers for picking up the semiconductor components at a first position. The semiconductor components attached or mounted to the pickup heads are then transferred from the first position to a second position. The semiconductor components are then detached from the pickup heads at the second position. However, many conventional systems and apparatuses for transferring semiconductor components have deficiencies in at least one of the picking up, transfer and detachment of the semiconductor components as discussed in the background above. Accordingly, improvements to apparatuses and methods for transferring of semiconductor components are needed for semiconductor fabrication.

For purposes of brevity and clarity, the description of the embodiments of the present invention is limited hereinafter to apparatuses and methods for transferring semiconductor components. A person skilled in the art will know that this does not preclude the embodiments of the present invention from other applications where fundamental principles prevalent among the various embodiments of the present invention such as operational, functional or performance characteristics are required.

Figure 1A:
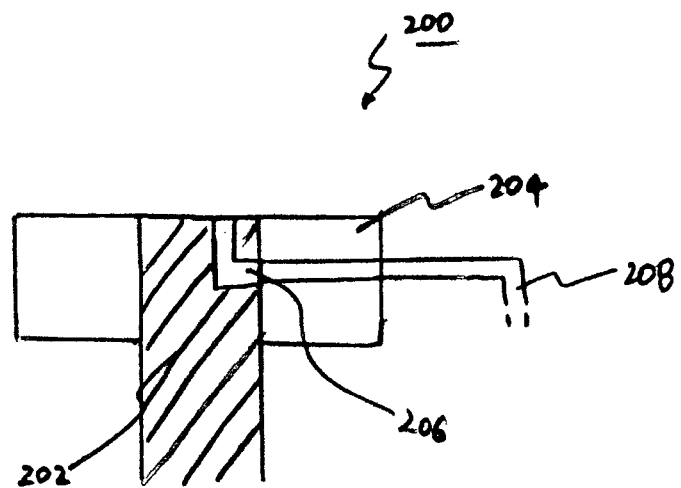
FIG. 1a shows a partial cross-sectional front view of a first exemplary turret structure used with a first existing apparatus for transferring semiconductor components, wherein a first pickup head is at a first position.
Figure 1B:
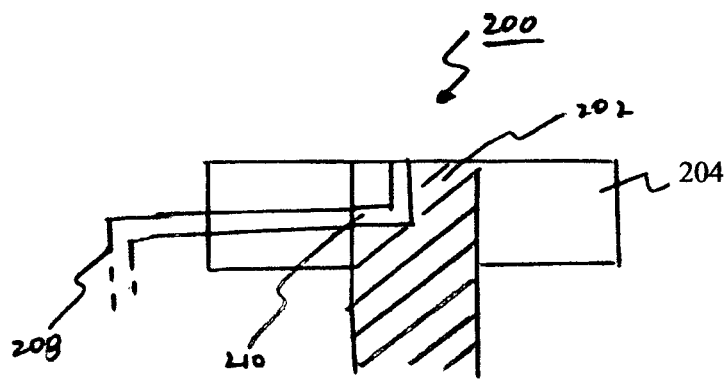
FIG. 1b shows a partial cross-sectional front view of a first exemplary turret structure of FIG. 1a, wherein the first pickup head is at a second position.
Figure 2:
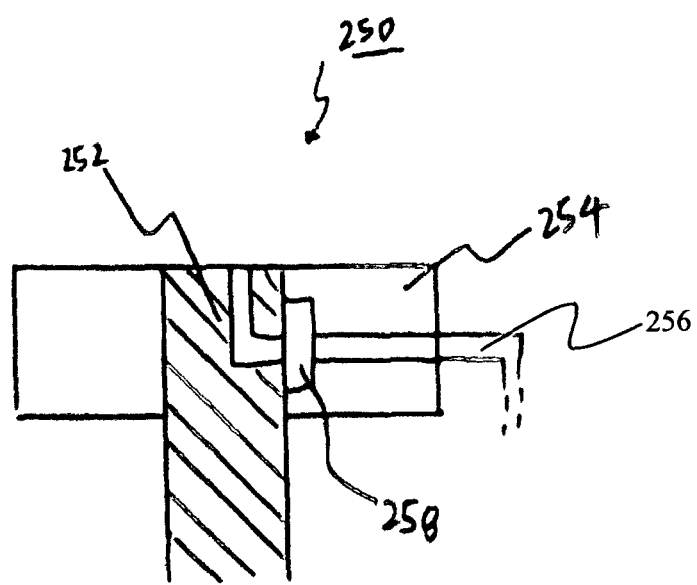
FIG. 2 shows a partial cross-sectional front view of a second exemplary turret structure used with a second existing apparatus for transferring semiconductor components.
Figure 3:
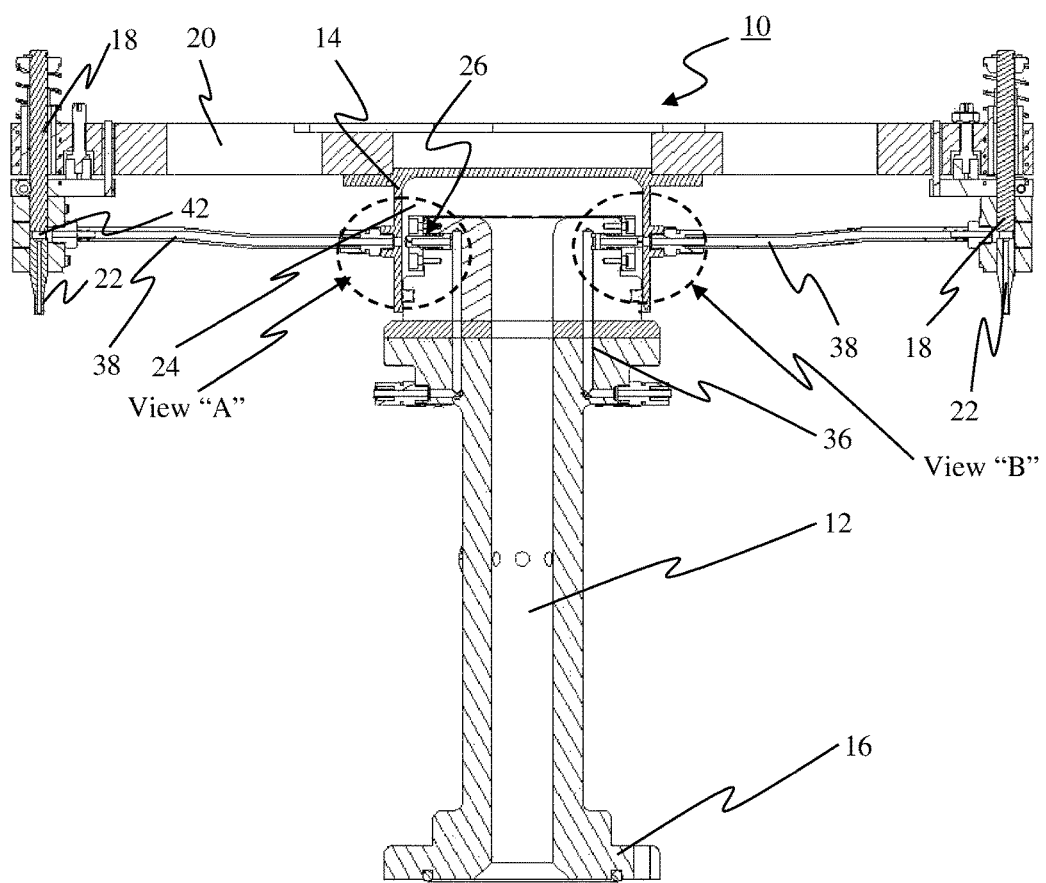
FIG. 3 shows a partial cross-sectional front view of an exemplary apparatus for transferring semiconductor components accordingly to an embodiment of the present invention.
Figure 4:
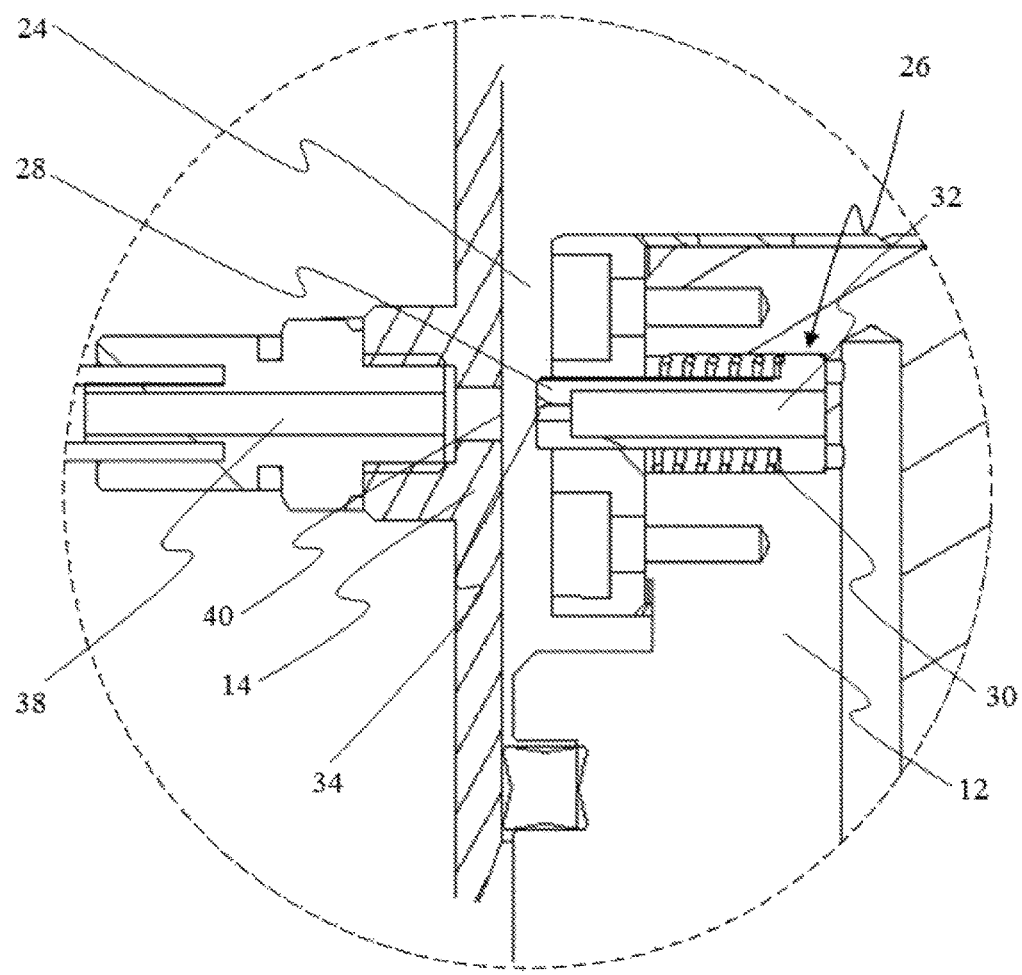
FIG. 4 is an enlarged cross-sectional front view between a central shaft and a rotatable portion of the apparatus of FIG. 3 according to View "A", wherein a plunger of the apparatus of FIG. 3 is at a retracted position.
Figure 5:
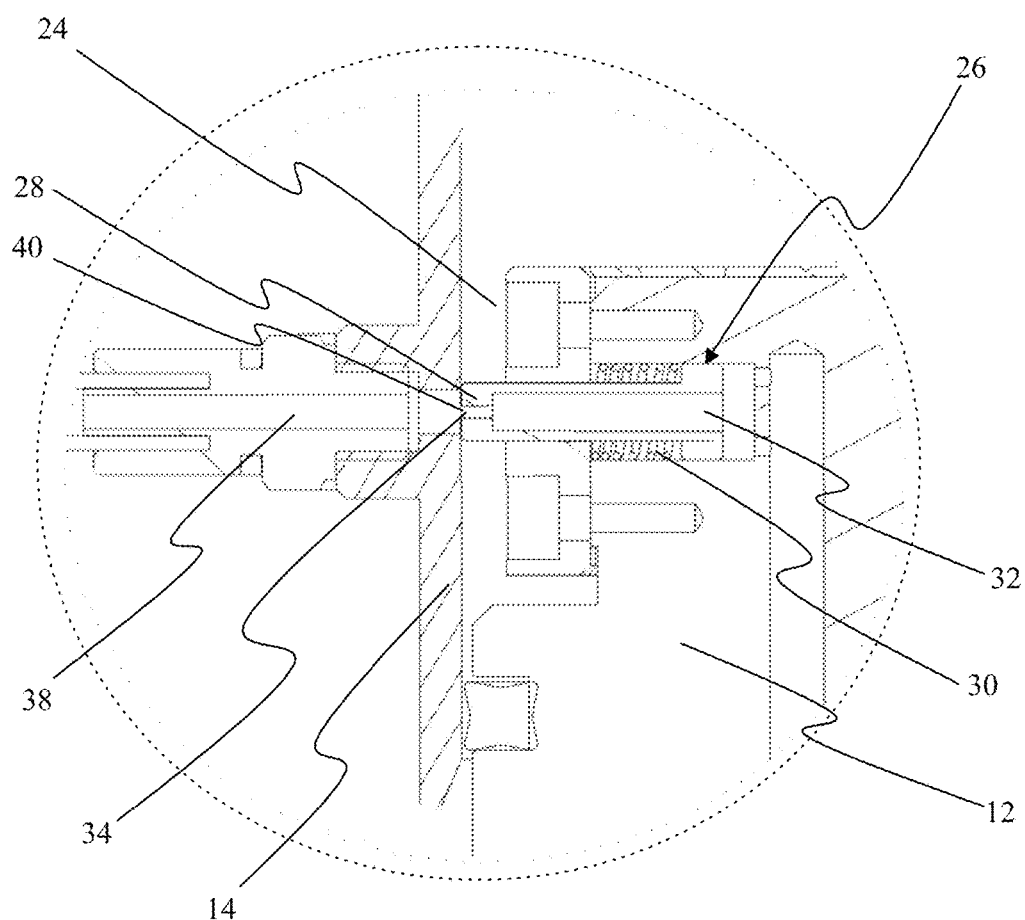
FIG. 5 is an enlarged cross-sectional front view of a second junction between the central shaft and the rotatable portion of the apparatus of FIG. 3 according to View "B", wherein the plunger of FIG. 3 is at an extended position.

An exemplary apparatus 10 for transferring semiconductor components as shown in FIG. 3 to FIG. 5 is provided by a first embodiment of the present invention. The semiconductor components (not shown) transferred by the apparatus 10 are for example semiconductor wafers, dies and integrated circuit (IC) chips. The apparatus 10 comprises a central shaft 12 (also known as a central structure, a fixed structure or the like structure) and a rotatable structure 14 (also known as a rotatory structure or a displaceable structure) coupled to the central shaft 12.

The central shaft 12 comprises a supporting base 16 or support. The supporting base 16 is typically placed or attached to a surface, for example a platform or floor, during operation of the apparatus 10.

The central shaft 12 preferably has a circular cross-section. Alternatively, the central shaft is of a different shape, size and configuration. It will be understood that should the central shaft 12 be of an alternative shape, size or configuration, the rotatable structure 14 or displaceable structure will follow an alternative travel profile around the central shaft 14.

The apparatus 10 further comprises a number of semiconductor component pick-up heads or semiconductor component handlers (hereinafter referred to as modules 18). The number of modules 18 is typically between and including sixteen and thirty-two. The modules 18 are coupled to the rotatable structure 14. Preferably, each module 18 is coupled to the rotatable structure 14 via an interconnect structure 20 or an interconnecting arm. The interconnect structure 20 can be directly or indirectly coupled to the motor or driver using methods or means known to a person skilled in the art. The interconnect structure 20 can rotate about the first axis during rotation of the rotatable structure 14.

The rotation of the rotatable structure 14 about the first axis effects rotational displacement of the modules 18 about the first axis. The modules 18 are displaced about the first axis along a predetermined travel profile or travel path. The predetermined travel profile can be altered as required using techniques known to a person skilled in the art.

Each module 18 is shaped and dimensioned for picking up semiconductor components. Each module 18 comprises means or a mechanism for picking up the semiconductor component (i.e. for attaching the semiconductor component thereto) as well as means or a mechanism for subsequently detaching or releasing the attached semiconductor component from the module 18. Each module 18 comprises a channel 22 or an airway defined therewithin through which fluid is communicatable. Vacuum or suction is applied via the channel 22 of the module 18 for picking up the semiconductor component. Air is purged through the channel 22 for facilitating detachment of the semiconductor component from the module 18. Alternative designs and structures of module 18 can be used for achieving the same function without deviating from the scope of the invention.

The central shaft 12 and the rotatable structure 14 cooperatively define a chamber or a space located therebetween. This chamber or space is hereinafter referred to as a vacuum chamber 24. The size, shape and configuration of the vacuum chamber 24 can be varied or adapted as required. Preferably, the vacuum chamber 24 extends continuously about the central shaft 12. Vacuum is created, maintained and controlled within the vacuum chamber 24. The substantial volume within the vacuum chamber 24 helps inhibit changes to vacuum pressure within the vacuum chamber 24 thereby facilitating maintenance of a constant and stable vacuum through the channel 22 of the module 18. In addition, vacuum is constantly applied through the channel 22 of the module 18 during displacement of the module 18 along the predetermined travel profile. A person skilled in the art looking at FIG. 3, which shows a cross-sectional front view of the apparatus 10 comprising the vacuum chamber 24, will understand that in a three-dimensional format, the vacuum chamber extends continuously about the central shaft.

The vacuum within the vacuum chamber 24 may be replaced with fluid, for example air. The vacuum, or alternatively pressure of the fluid within the vacuum chamber 24, is controllable and adjustable as required.

The apparatus 10 further comprises at least one inlet port or inlet line (not shown), which is in fluid communication with the vacuum chamber 24. The inlet port is located within, or is coupled to, the central shaft 12 at a portion of the supporting base 16. The inlet port facilitates at least one of provision, maintenance and control of the vacuum within the vacuum chamber 24. A control mechanism (not shown) can be attached or coupled to the inlet port for controlling the vacuum within the vacuum chamber 24. Alternatively, the inlet port facilitates supply of fluid into the vacuum chamber 24. The control mechanism is capable of controlling the supply of fluid into the vacuum chamber 24.

The central shaft 12 further comprises at least one purging mechanism 26 (also known as purge plungers or plungers) located at a predetermined position. The purging mechanism 26 is preferably located at a circumferential periphery of the central shaft 12. It will be appreciated by a person skilled in the art that the number and location of the purging mechanism 26 can be altered as required. The purging mechanism 26 is installed at a location corresponding to a predetermined position along the predetermined travel profile of the module 18. More specifically, the purging mechanism 26 is preferably installed at a location corresponding to a predetermined position along the predetermined travel profile of the module 18 whereat the semiconductor component is to be detached from the module 18.

Figure 6:
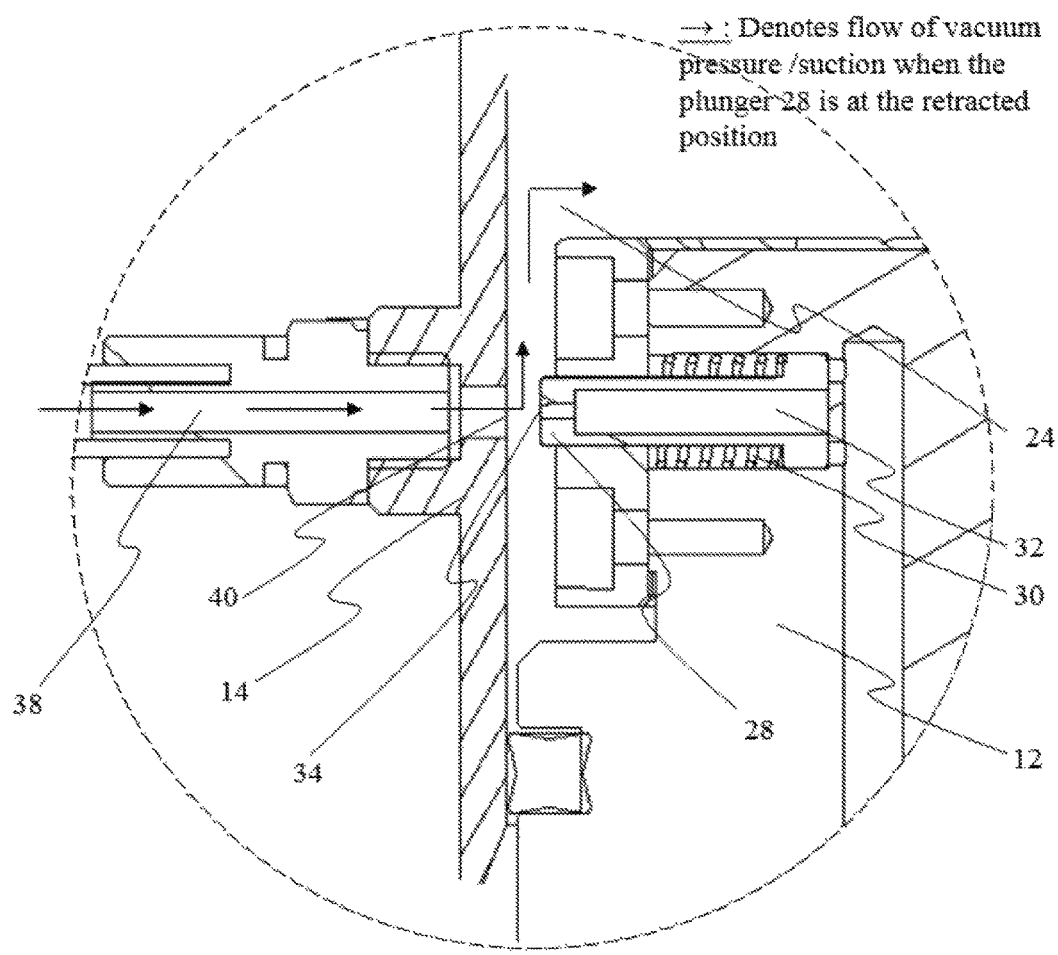
FIG. 6 shows a direction of applied vacuum pressure when the plunger of the apparatus of FIG. 3 is at the retracted position.
Figure 7:
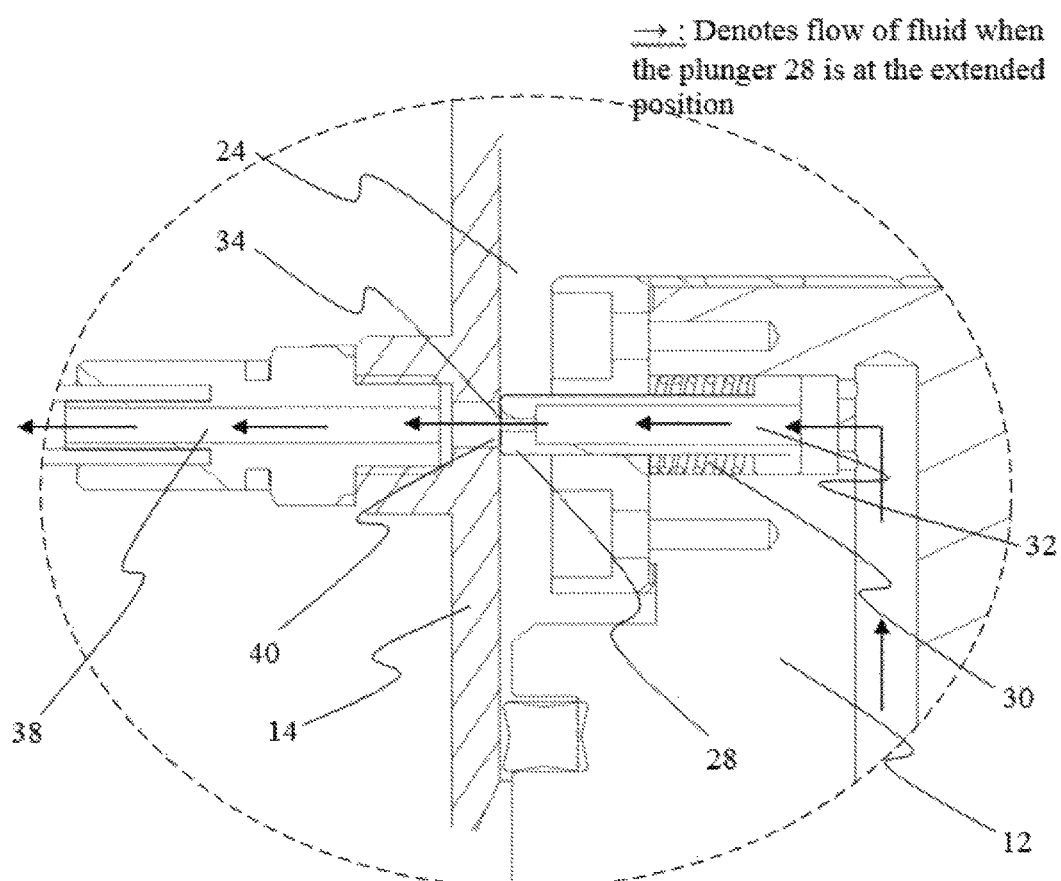
FIG. 7 shows a direction of fluid flow or purge when the plunger of the apparatus of FIG. 3 is at the extended position.

The purging mechanism 26 comprises a plunger 28 operable for displacement between a retracted position as shown in FIG. 4 and FIG. 6 and an extended position as shown in FIG. 5 and FIG. 7. The purging mechanism 26 further comprises a biasing mechanism 30 or a biasing element for biasing the plunger 28 at the retracted position. The biasing mechanism 30 comprises at least one spring, the number of springs being variable as required. The biasing mechanism 30 is capable of biasing or keeping the plunger 28 at the retracted position independently. Alternatively, the plunger 28 is biased or maintained at the retracted position by a combination of the biasing mechanism 30 and the vacuum within the vacuum chamber 24. In addition, the purging mechanism 26 comprises a channel 32 (also known as an air passage, an airway or an air tube) defined through the plunger 28. The channel 32 enables fluid communication through the plunger 28. More specifically, the channel 32 enables communication of air through the plunger 28.

The channel 32 comprises a first opening 34 defined at a first terminal thereof. The first opening 34 is directly adjacent (i.e. opening into) the vacuum chamber 24 when the plunger 28 is at the retracted position. The channel 32 is further fluidly connected to or communicatable with a central fluid supply or fluid source (not shown). The channel 32 is fluidly connected with the central fluid supply via an air tube defined within the central shaft 12. The apparatus 10 can comprise a control module (not shown) coupled to the air tube 38 for at least one of setting, controlling and adjusting volume and pressure of fluid introduced into the channel 32.

As previously mentioned, the plunger 28 is operable for displacement between the retracted position (as shown in FIG. 4 and FIG. 6) and the extended position (as shown in FIG. 5 and FIG. 7). Preferably, an introduction of fluid into the channel 32 of the plunger 28 triggers displacement of the plunger 28 from the retracted position to the extended position. When at the extended position, the plunger 28 extends into the vacuum chamber 24 and abuts the rotatable structure 14. Alternatively, the plunger is disposed adjacent the rotating structure 14 when at the extended position. At least one of initiation, extent, and speed of displacement of the plunger 28 from the retracted position to the extended position can be controlled and adjusted as required. For example, the at least one of initiation, extent, and speed of displacement of the plunger 28 of the purging mechanism 26 can be software controlled.

When at the extended position the plunger 28 is spatially disposed for substantially impeding fluid communication between the vacuum chamber 24 and the channel 22 of the module 18. The plunger 28 enables purging of fluid into the channel 22 of the module when at the extended position. Impediment of fluid communication between the vacuum chamber 24 and the channel 22 of the module 18 when the plunger 28 is at the extended position substantially reduces changes to the vacuum, more specifically changes to the vacuum pressure, in the vacuum chamber 24.

The apparatus 10 further comprises a number of tubes 38 for mediating fluid communication between the vacuum chamber 24 and the channels 22 of the modules 18. Vacuum can be supplied through any one of the number of tubes 38 and through the channel 22 of a corresponding module 18 for picking up the semiconductor component. In addition, air can be purged through any one of the number of tubes 38 through the channel 22 of the corresponding module 18 for detaching the attached semiconductor component from the module 18. Furthermore, vacuum can be supplied through the number of tubes 38 and through the channels of corresponding modules 18 for securing the semiconductor components received thereby.

Each of the number of tubes 38 comprises a first opening 40 defined at a first terminal thereof, the first opening being proximal to the vacuum chamber 24. The first opening is directly adjacent and opens into, the vacuum chamber 24. Each of the number of tubes 38 comprises a second opening 42 defined at a second terminal thereof, the second opening being distal to the vacuum chamber 24. The second opening is directly connectable or communicatable with the channel 22 of the corresponding module 18.

As previously mentioned, the displacement of the plunger 28 to the extended position causes the plunger 28 to make physical contact with the rotatable structure 14. The displacement of the plunger 28 to the extended position further juxtaposes the first opening 34 of the channel 32 within the plunger 28 with the first opening 40 of a corresponding tube 38.

The control of the extent and speed of displacement of the plunger 28 from the retracted position to the extended position facilitates precise purging of air or fluid through the channel 32 of the plunger 28 into the tube 38, and subsequently into the channel 22 of the corresponding module 18, for facilitating a more accurate detachment of the semiconductor component from the module 18.

In addition, the displacement of the plunger 28 from the retracted position through the vacuum chamber 24 for abutting with the rotatable structure 14 when at the extended position helps to prevent or reduce changes to the vacuum or air pressure within the vacuum chamber 24. Prevention or reduction of vacuum fluctuations within the vacuum chamber 24 is important for effecting reliable securing of the semiconductor components to the module 18 while the modules 18 are rotating about the first axis. In addition, the ability to maintain a continuous and constant vacuum in the vacuum chamber 24 enables a correspondingly continuous and constant application of vacuum onto the semiconductor components attached to the modules 18 while the modules 18 are rotating about the first axis. The vacuum chamber 24 is an important feature of the apparatus 10 provided by the first embodiment of the present invention because it helps to maintain a continuous and constant vacuum for securing the semiconductor components to the modules 18.

In addition, the use of the vacuum chamber 24 removes the need for valves in maintaining a continuous vacuum for securing the components to the pick-up heads (equivalent to the modules 18) as with conventional semiconductor handling apparatuses such as those mentioned in the background above. The inhibition of application of vacuum pressure between the channel 22 of the module 18 and the chamber 24 (and the fluid communication between the channel 32 of the plunger 28 and the channel 22 of the module 18) is achieved by way of the displacement of the plunger 28 to the extended position. In addition, the application of the vacuum pressure between the channel 22 of the module 18 and the chamber 24 (and the disconnection or discontinuation of fluid communication between the channel 32 of the plunger 28 from the channel 22 of the module) is achieved by way of displacement of the plunger 28 to the retracted position.

Figure 8:
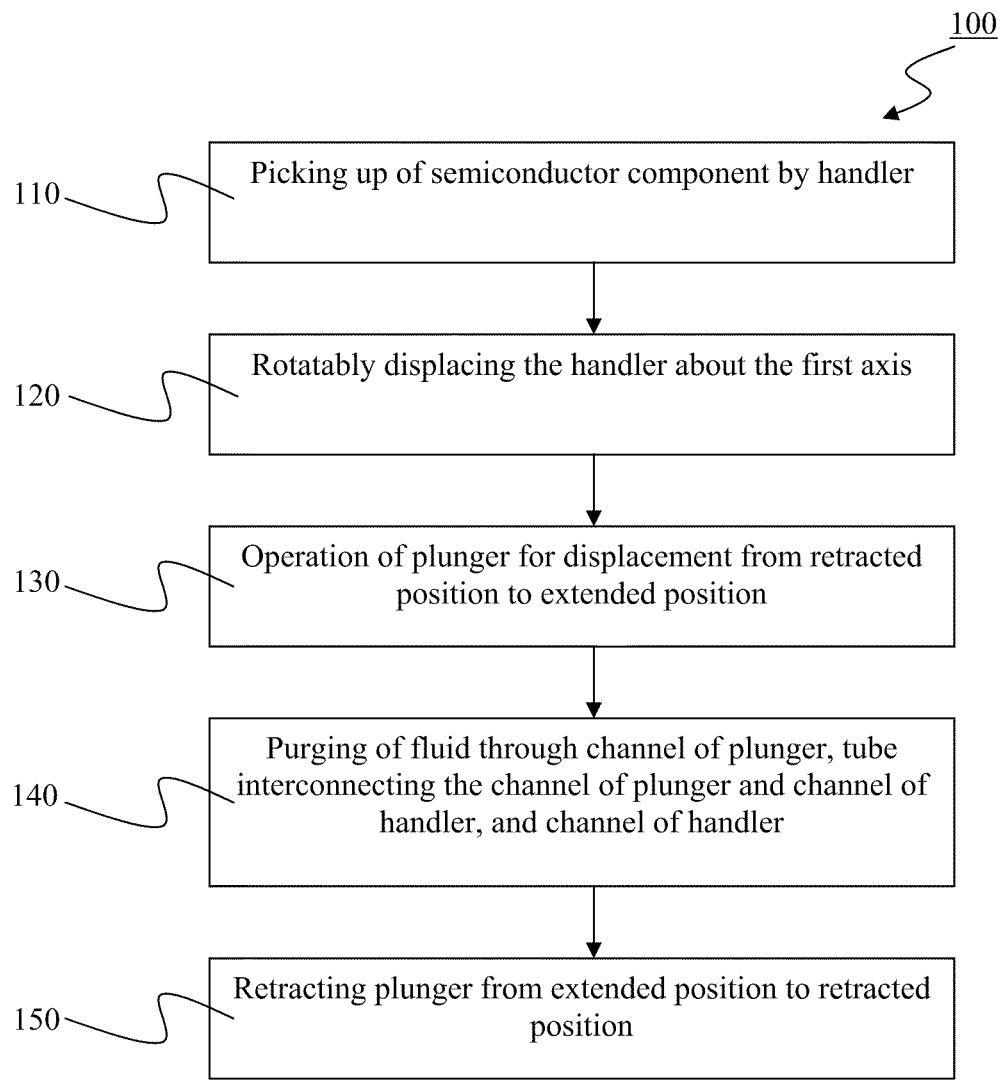
FIG. 8 is a flowchart of an exemplary method for transferring a semiconductor component according to an embodiment of the present invention.

An exemplary method 100 for transferring semiconductor components is also provided according to a second embodiment of the present invention. A flowchart of the exemplary method 100 is shown in FIG. 8.

In a step 110 of the method 100, the module 18 of the apparatus 10 picks up the semiconductor components at a first position (also known as an input position). Vacuum or suction from the vacuum chamber 24 is communicated via the tube 38 to the channel 22 of the module 18 for enabling pick up of the semiconductor component onto the module 18. The vacuum or suction is controllable and adjustable as required. The vacuum for enabling pick up of the semiconductor component onto the module 18 is preferably software controlled, and adjustable as required. The presence of the vacuum chamber 24 enhances ease and accuracy of the vacuum being applied through the tube 38 and the channel 22 of the module 18 for picking up of the semiconductor component by the module 18.

In a step 120, the module 18 is displaced about the first axis from the first position to a second position (also known as an output position). The displacement of the module 18 from the first position to the second position correspondingly displaces the semiconductor component attached to the module 18 from the first position to the second position. As previously described, the module 18, and correspondingly the semiconductor component, is displaced about the first axis or rotational axis along the predetermined travel profile.

The semiconductor component is secured to the module 18 during the displacement of semiconductor component along the predetermined travel profile from the first position to the second position. As previously described, a continuous and constant vacuum is applied onto the semiconductor component for securing the semiconductor component to the module 18. More specifically, vacuum is applied via the tube 38 and the channel 22 of the module 18 onto the semiconductor component for securing the semiconductor component to the module 18 during displacement of the semiconductor component.

The continuous and constant vacuum for securing the semiconductor component to the module 18 is maintained by presence of the vacuum chamber 24 defined between the central shaft 12 and the rotatable structure 14. The vacuum within the vacuum chamber 24, and accordingly, the vacuum applied to the semiconductor component attached to the module 18 is controllable and adjustable as required. Control and adjustment of the vacuum is can be effected by the control mechanism. For example, the control and adjustment of the vacuum can be adjustable by use of inlets and valves connected to the inlet port.

Preferably, the semiconductor components undergo a series of processing steps while being transferred or displaced between the first position and the second position. The processing steps include, but are not limited to, visual defect inspection and electrical testing. The processing of the semiconductor components as the semiconductor components are transferred or displaced from the first position to the second position is performed by processing modules or stations (not shown) that are positioned along the predetermined travel profile. Such processing modules include, but are not limited to, image capture devices or cameras and electrical testing modules. The number and type of processing modules may be varied as required.

The processing modules are arranged in a predetermined spatial configuration or disposition for processing the semiconductor components as the semiconductor components are displaced along the predetermined travel profile. The spatial configuration of the processing modules is determined for at least one of maximizing space utilization of the apparatus 10 and for increasing the number of processing modules useable with the apparatus 10.

FIG. 4 and FIG. 6 show the plunger at the retracted position. As shown in FIG. 6, vacuum maintained in the vacuum chamber 24 enables application of a continuous and constant vacuum pressure or suction through the tube 38. Vacuum pressure or suction through the tube 38 is further translated through the channel 22 of the handler 18 to secure the semiconductor component to the module 18.

In a step 130, operation or activation of the plunger 28 displaces the plunger 28 from the retracted position to the extended position. FIG. 5 and FIG. 7 show the plunger 18 at the extended position. The operation or activation of the plunger 28 is preferably software controlled. The biasing mechanism 30 facilitates the maintenance of the plunger 28 at the retracted position. As previously described, the plunger 28 is preferably biased or maintained at the retracted position by the biasing mechanism 30 independently. The displacement of the plunger 28 from the refracted position to the extended position displaces the plunger 28 across the vacuum chamber 24 towards the rotatable structure 14. Preferably, the plunger 28 abuts the rotatable structure 14 when at the extended position. Further preferably, the first opening 34 of the channel 32 defined within the plunger 28 is directly adjacent or juxtaposed with the first opening 34 of the corresponding air tube 38 when the plunger 28 is at the extended position. The extension of the plunger 28 through the vacuum chamber 24 for abutting with the rotatable structure 14 helps to reduce or prevent significant changes to the vacuum within the vacuum chamber 24.

In a step 140, fluid is purged through the channel 32 within the plunger 28 through the tube 38 and subsequently through the channel 22 of the corresponding module 18 to thereby displace or detach the semiconductor component from the module 18. The direction of fluid purge when the plunger 28 is at the extended position is shown in FIG. 7. The step 140 occurs while the plunger 28 is at the extended position. The pressure of the fluid being purged through the channel 32 within the plunger 28 can be controlled and varied as required. The position of the plunger 28 at the extended position during the step 140 reduces or prevents significant variation of the vacuum within the vacuum chamber 24.

In a step 150, the plunger 28 is retracted from the extended position to the retracted position before the module 18 is rotatably displaced from the second position back to the first position in a step 160. It will be appreciated that the plunger 28 is biased at the retracted position by at least one of the biasing mechanism 30 and the vacuum maintained within the vacuum chamber 24 during rotation of the module 18 about the first axis. The plunger 28 is activated for displacement from the retracted position to the extended position at predetermined instances as required.

As previously mentioned, the plunger 28 is positioned at a predetermined position along the periphery of the central shaft 12. More specifically, the plunger 28 is positioned to correspond with a location along the predetermined travel profile at which semiconductor components are to be displaced or detached from the module 18. The present invention enables specific matching or mating of plunger 28 activation with positioning of a corresponding module 18 for effecting an accurate and precise detachment of the semiconductor component at the predetermined location as required. In addition, the use of plunger 28 displacement for facilitating purging of air through the air tube 38 and channel 22 of the module 18 to thereby detach the semiconductor component helps reduce or prevent significant changes to the vacuum in the vacuum chamber 24. This in turn enables maintenance of a continuous and constant vacuum within the vacuum chamber for securing other semiconductor components to the other modules 18 of the apparatus 10. Furthermore, the matching or mating of plunger 28 with the air tube 38 and channel 22 of the module 18 represents a simple structural design that removes the need for valves as with many conventional apparatuses.

The use of vacuum enables securing of the semiconductor components to the modules 18 even at a wide range of speeds of displacement of the modules 18 along the predetermined travel profile. Sequence of the above-described steps 110 to 150 of the method 100 can be varied as required. In addition, performance, duration and number of repetition of the above-described steps 110 to 150 of the method 100 can be varied as required.

In addition, a person skilled in the art will understand that there are alternative embodiments of the present invention from those described above. For example, a third embodiment of the present invention provides an apparatus (not shown) comprising a first structure and a second structure coupled to the first structure. The function of the first structure and the second structure corresponds with the central shaft 12 and the rotatable structure 14 respectively. Each of the first structure and the second structure can be of varying shapes, sizes and configurations. A chamber, also known as a space or gap, is defined between the first structure and the second structure. The second structure is displaceable relative the first structure. Preferably, the second structure is displaced along a predetermined travel profile around the first structure. Alternatively, the second structure can be displaced along a side of the first structure. The travel profile of the second structure can be varied as required.

The second structure comprises a number of modules or handlers coupled thereto. The modules coupled to the second structure correspond with the modules 18 of the apparatus 10 described above. As with the modules 18 of the apparatus 10, the modules of the second structure also comprises a passageway defined therethrough. The passageway is fluidly communicable with the chamber. Vacuum is present and maintained in the chamber. Alternatively, fluid, for example air, is present in the chamber. Pressure of fluid within the chamber 22 is preferably maintained at a constant value.

The apparatus provided by the third embodiment of the present invention further comprises a plunger. The plunger preferably has equivalent functional, operational and structural characteristics as the plunger 28 of the apparatus 10. For example the plunger is displaceable between a retracted position and an extended position. When the plunger is at the extended position, the plunger is spatially disposed for substantially impeding fluid communication between the chamber and the passageway. In addition, when the plunger is at the extended position, the plunger further provides either vacuum or fluid to the passageway of the module. This will especially help in detaching the semiconductor device from the module at higher speeds when the volume of the chamber has a higher ratio of air compared to vacuum. The plunger comprises a channel defined therethrough through which the vacuum or fluid is conveyed. Vacuum provided through the passageway of the module enables attachment or securing of the semiconductor component to the module. Fluid purged through the passageway of the plunger causes detachment of the semiconductor component from the module.

As mentioned above, the spatial disposition of the plunger at the extended position impedes fluid communication between the chamber and the passageway. The spatial disposition of the plunger at the extended position also helps reduce changes to the vacuum or fluid pressure within the chamber. This is important to prevent vacuum or fluid pressure changes in the passageways of other modules should the apparatus comprises multiple modules.

In the foregoing manner, exemplary apparatuses and methods for transferring semiconductor components provided by embodiments of the present invention are described. The exemplary apparatuses and methods address at least one of the issues faced by existing semiconductor inspection systems and methods as mentioned above. It will however be understood by a person skilled in the art that the present invention is not limited to specific forms, arrangements or structures of the embodiments described above. It will be apparent to a person skilled in the art in view of this disclosure that numerous changes and/or modifications can be made without departing from the scope and spirit of the invention.

The invention claimed is:

1. An apparatus for handling components, comprising:
a first structure having a hollow therein;
a second structure coupled to the first structure thereby defining a chamber between the first structure and the second structure and within which a vacuum pressure is applied, the chamber extending into the hollow of the first structure, the chamber being connected to a source of vacuum which can be regulated and controlled;
a plurality of pick-up heads carried by the second structure, each of the pick-up heads having an airway therein, through which fluid is communicable from the pick-up head into the chamber and by which vacuum pressure is applied to attach and hold a component to the pick-up head; and
a set of plungers, each plunger having a channel therethrough, each plunger disposed at a predetermined plunger position on the first structure, each plunger being displaceable within the chamber between a retracted position and an extended position,
wherein when a first plunger within the set of plungers is at the retracted position fluid communication between the chamber and a selected pick-up head of said plurality of pick-up heads aligned with the plunger position of the first plunger is not impeded, and wherein when the first plunger within the set of plungers is at the extended position, (a) fluid communication between the vacuum chamber and the selected pick-up head of said plurality of pick-up heads aligned with the plunger position of the first plunger is impeded, (b) a fluid purge is applied through the channel of the first plunger into the airway of the selected pick-up head of said plurality of pick-up heads to detach the component held by the selected pickup-head of said plurality of pick-up heads from the selected pick-up head of said plurality of pick-up heads, and (c) vacuum pressure within the chamber and within the airways of pick-up heads of said plurality of pick-up heads other than the selected pick-up head of said plurality of pick-up heads remains substantially unchanged.

2. The apparatus as in claim 1, further comprising:
a tube interconnecting the airway of the selected pick-up head of said plurality of pick-up heads with the chamber, the tube having a first terminal providing an opening to the chamber,
wherein when the first plunger is at the extended position, the first plunger juxtaposes the opening of the tube to thereby facilitate direct purging of fluid from the channel of the first plunger into the tube.

3. The apparatus as in claim 2, wherein the first plunger abuts a surface of the second structure when at the extended position, the abutment of the plunger with the surface of the second structure facilitating the impediment of fluid communication between the chamber and the airway of the selected pick-up head of said plurality of pick-up heads.

4. The apparatus as in claim 1, wherein each plunger within the set of plungers is normally biased at the retracted position.

5. The apparatus as in claim 4, wherein each plunger within the set of plungers comprises a biasing mechanism for resiliently biasing the plunger at the retracted position.

6. The apparatus as in claim 1, wherein the second structure is displaceable with reference to the first structure.

7. The apparatus as in claim 6, wherein the first structure is a shaft having an axis, the second structure being displaceable about the shaft for correspondingly displacing the second structure between a first position and a second position along a predetermined travel profile.

8. The apparatus as in claim 7, wherein the second structure is rotatably displaceable about the axis between the first position and the second position along the predetermined travel profile.

9. The apparatus as in claim 8, further comprising:
a plurality of processing modules positioned along the predetermined travel profile, the plurality of processing modules for facilitating processing of the components received by the plurality of pick-up heads when the plurality of pick-up heads are being displaced along the predetermined travel profile.

10. The apparatus as in claim 8, wherein the first plunger is at the retracted position when the selected pick-up head is at a first position along the predetermined travel profile and at the extended position when the selected pick-up head is at a second position along the predetermined travel profile.

11. The apparatus as in claim 10, wherein the chamber provides vacuum through the airway of the selected pick-up head of said plurality of pick-up heads for attaching the component to the selected pick-up head of said plurality of pick-up heads when the selected pick-up head of said plurality of pick-up heads is at the first position.

12. The apparatus of claim 8, wherein each plunger within the set of plungers is displaceable toward the selected pick-up head along a direction other than the axis of the shaft as the second structure is rotatably displaced about the axis of the shaft.

13. The apparatus of claim 7, wherein each plunger within the set of plungers is circumferentially disposed about the shaft.

14. The apparatus of claim 7, wherein the hollow of the first structure extends along the axis of the shaft, and wherein the chamber extends along the axis of the shaft.

15. The apparatus as in claim 1, further comprising:
an inlet coupled to the chamber for supplying one of vacuum and fluid into the chamber; and
a valve coupled to the inlet for controlling the one of vacuum and fluid supplied into the chamber.

16. The apparatus as in claim 1, further comprising:
a motor coupled thereto, the motor being operable for driving displacement of the second structure about the first structure.

17. The apparatus as in claim 16, further comprising:
a programmable controller, the programmable controller being in signal communication with at least one of the motor and the set of plungers for controlling the displacement thereof.

18. The apparatus as in claim 1, wherein the first structure is a turret having an axis that extends centrally along the hollow of the turret, the second structure being rotatably displaced about the axis along a predetermined travel profile such that the plurality of pick-up heads rotates about the turret.

19. The apparatus as in claim 18, further comprising:
a plurality of processing modules positioned along the predetermined travel profile, the plurality of processing modules for facilitating processing of components received from the plurality of pick-up heads as the plurality of pick-up heads rotate about the turret.

20. The apparatus of claim 1, wherein the set of plungers removes the need for a valve on the selected pick-up head of said plurality of pick-up heads in maintaining a continuous vacuum for securing the component to the selected pick-up head of said plurality of pick-up heads.

21. The apparatus of claim 1, wherein the set of plungers comprises a plurality of plungers, a portion of each plunger within the plurality of plungers disposed within the chamber.

22. The apparatus of claim 1, further comprising a fluid supply coupled to the channel of the first plunger to provide the fluid purge when the first plunger is at the extended position.

23. The apparatus of claim 1, wherein the component is a semiconductor component.

24. A method for handling components, the method comprising:
providing a component handling apparatus comprising:
a first structure having a hollow therein;
a second structure coupled to the first structure thereby defining a chamber between the first structure and the second structure and within which a vacuum pressure is applied, the chamber extending into the hollow of the first structure, the chamber being connected to a source of vacuum which can be regulated and controlled;
a plurality of pick-up heads carried by the second structure, each of the pick-up heads having an airway therein, through which fluid is communicable from the pick-up head into the chamber and by which vacuum pressure is applied to attach and hold a component to the pick-up head; and a set of plungers, each plunger having a channel therethrough, each plunger disposed at a predetermined plunger position on the first structure, each plunger being displaceable within the chamber between a retracted position and an extended position;

attaching a component to a selected pick-up head of said plurality of pick-up heads by positioning the selected pick-up head of said plurality of pick-up heads at an input position of the component handling apparatus and communicating the vacuum pressure from the chamber through the airway of the selected pick-up head of said plurality of pick-up heads to the component;

displacing the first structure relative to the second structure to displace the selected pick-up head of said plurality of pick-up heads along a predetermined travel profile such that the selected pick-up head of said plurality of pick-up heads travels from the input position to an output position of the component handling apparatus, the output position corresponding to the plunger position of a first plunger within the set of plungers; and when the selected pick-up head of said plurality of pick-up heads is at the output position, (a) displacing the first plunger within the set of plungers from the retracted position to the extended position to thereby impede fluid communication between the vacuum chamber and the airway of the selected pick-up head of said plurality of pick-up heads, while (b) simultaneously applying a fluid purge through the channel of the first plunger into the airway of the selected pick-up head of said plurality of pick-up heads to thereby detach the component held by the selected pick-up head of said plurality of pick-up heads from the selected pick-up head of said plurality of pick-up heads, wherein vacuum pressure within the chamber and within the airways of pick-up heads of said plurality of pick-up heads other than the selected pick-up head of said plurality of pick-up heads remain substantially unchanged while the first plunger with the set of plungers is at the extended position.

25. The method as in claim 24, wherein the component handling apparatus includes a tube that fluidly couples the chamber with the airway of the selected pick-up head of said plurality of pick-up heads, the tube having a first terminal defining an opening into the chamber, wherein displacing the first plunger within the set of plungers from the retracted position to the extended position juxtaposes the opening of the tube with the channel of the first plunger within the set of plungers to thereby facilitate direct purging of fluid from the channel of the first plunger of the set of plungers into the tube.

26. The method as in claim 25, wherein displacing the first plunger within the set of plungers from the retracted position to the extended position causes the first plunger within the set of plungers to abut a surface of the first structure to thereby facilitate the impediment of fluid communication between the chamber and the airway of the selected pick-up head of said plurality of pick-up heads.

27. The method as in claim 24,
wherein displacing the first plunger within the set of plungers from the retracted position to the extended position occurs in response to an introduction of a fluid into the channel of the first plunge.

28. The method as in claim 24, further comprising biasing the first plunger within the set of plungers at the retracted position.

29. The method as in claim 28, wherein biasing the first plunger within the set of plungers at the retracted position occurs by way of a resilient biasing mechanism.

30. The method as in claim 24, further comprising:
displacing the first structure relative to the second structure to thereby displace the first pick-up head of said plurality of pick-up heads along the predetermined travel profile from the output position of the component handler back to the input position of the component handler.

31. The method as in claim 30, wherein the second structure comprises a turret defining an axis, and wherein displacing the first structure relative to the second structure comprises rotatably displacing the first structure about the axis for correspondingly displacing the selected pick-up head of said plurality of pick-up heads between the input position and the output position along the predetermined travel profile.

32. The method as in claim 31, further comprising:
processing the component during the displacement of the selected pick-up head of said plurality of pick-up heads along the predetermined travel profile, the processing of the component being effected by a plurality of processing modules positioned along the predetermined travel profile.

33. The method as in claim 32, further comprising:
providing a motor for driving the displacement of the first structure relative to the second structure; and
providing a programmable controller, the programmable controller being in signal communication with at least one of the motor and the first plunger within the set of plungers for controlling the displacement of the first plunger within the set of plungers.

* * * * *